United States Patent [19]
Rohde et al.

[11] Patent Number: 4,467,634
[45] Date of Patent: Aug. 28, 1984

[54] INTERNAL COMBUSTION ENGINE KNOCKING SENSING AND RECOGNITION SYSTEM

[75] Inventors: Siegfried Rohde, Schwieberdingen; Jörg Bonitz, Mühlacker; Robert Entenmann, Benningen; Rochus Knab, Kornwestheim; Herbert Schramm, Stuttgart, all of Fed. Rep. of Germany

[73] Assignee: Robert Bosch GmbH, Stuttgart, Fed. Rep. of Germany

[21] Appl. No.: 397,094

[22] Filed: Jul. 12, 1982

[30] Foreign Application Priority Data

Aug. 26, 1981 [DE] Fed. Rep. of Germany ....... 3133703

[51] Int. Cl.³ ............................................ G01L 23/22
[52] U.S. Cl. ............................................... 73/35
[58] Field of Search ..................... 73/35; 123/425, 435

[56] References Cited
U.S. PATENT DOCUMENTS 4,106,447  8/1978  West ................................ 73/35 X
4,391,126  7/1983  Zanten ................................ 73/35

Primary Examiner—James J. Gill
Attorney, Agent, or Firm—Frishauf, Holtz, Goodman & Woodward

[57] ABSTRACT

A knocking sensor (10) which provides output signals representative of combustion condition under knocking to thereby generate knocking signals which have mixed therewith noise or stray interference signals, and which also furnishes noise or stray interference signals under other than knocking combustion conditions, has its output connected to a plurality of parallel connected selective filters (2, 3). The filters have different pass band frequencies. One of the filters (3) is tuned to sense knocking frequencies, one or more other filters (2) being tuned to preferentially select noise or interference signals. A selection and discriminating circuit (10) having comparators (11) is provided connected to the filters to eliminate noise signals by comparing the signal level of the output received from the filters with a reference, which may be a dynamic reference, the outputs from the discriminators being processed in a logic circuit (15) to provide output signals (18) if (1) the filtered signal having the frequencies expected upon knocking exceeds a threshold level and (2) the filtered signal having the frequency band of the stray, or noise signals is below a threshold level and, preferably, a knocking signal persists for a time in excess of a time interval as determined by a timing circuit (16). Preferably, non-linear circuits such as logarithmic circuits (4, 5), are connected between the outputs from the filters (2, 3) and the comparators (11, 12) of the selection or recognition or discriminating circuit (10).

15 Claims, 2 Drawing Figures

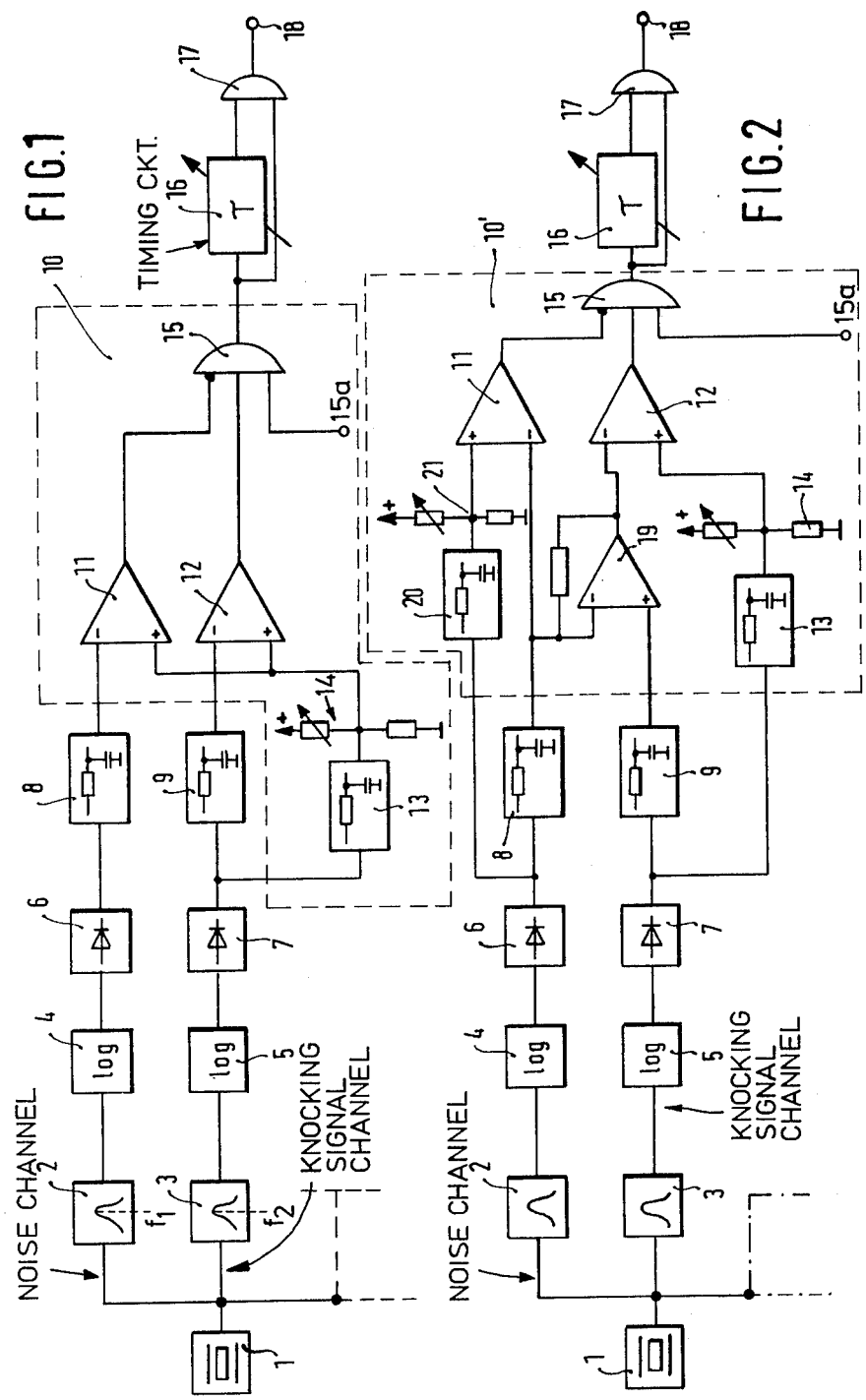

INTERNAL COMBUSTION ENGINE KNOCKING SENSING AND RECOGNITION SYSTEM

Cross reference to related application, assigned to the assignee of the present application: U.S. Ser. No. 389,586, filed June 18, 1982 SELLMAIER et al.

The present invention relates to a system to determine if the operating condition of an internal combustion (IC) engine is such that knocking or pinging may result, and more particularly to a system to recognize and discriminate signals derived from a knock sensor from background, noise or disturbance signals, so that knocking or pinging conditions can be unambiguously determined.

BACKGROUND

Various systems and arrangements to determine knocking or pinging of an IC engine are known; one such system is described in U.S. Pat. No. 4,106,447. As described, a knocking sensor generates a signal which includes signal components representative of knocking oscillations and background and noise signals. The composite signal is applied to a demodulator which has a background signal branch and a knocking signal branch. The demodulator circuit is connected to a comparator. The background noise signal is separated by a low-pass filter. Comparison of the background noise signal with the knocking signal in the comparator results in a digital output signal representative of "yes"/"no" regarding knocking conditions. Disturbance or noise signals which occur during the time of knocking, and within a measuring window range, cannot be eliminated, however, and may be recognized as knocking signals, although knocking, itself, did not occur. Such background or noise signals which may, erroneously, be considered as knocking signal, could be generated by mechanical impacts to which the knock sensor is subjected, for example by impacts having steep flanks, and caused, for example, by noise signals due to piston operation of the IC engine.

THE INVENTION

It is an object to improve a knocking recognition circuit to provide unambiguous output from a knocking sensor whether engine operating conditions are in the knocking range or in an appropriate and proper operating range.

Briefly, at least two frequency selective filters are used, the filters having different pass frequencies. The filters are connected to the knocking sensor. One of the filters is tuned to pass the frequencies expected upon engine knocking, and at least one other filter is tuned to pass the frequency band which is expected due to noise or interference signals. A selection and discriminating circuit is connected to receive the signals from both the filters and for responding to the outputs from the filters. A logic circuit logically analyzes the filtered output, each compared with respect to a threshold level and passes only signals representative of engine knocking by eliminating the noise or interference signals based on the logic conditions: (1) knock frequency signals above threshold; AND (2) noise frequency signals below threshold.

The system has the advantage that noise signals can be eliminated even within a measuring window, for example set to occur during a predetermined time interval with respect to engine operation, related to a particular piston position—typically top dead center (TDC) position—of the piston. By eliminating noise components even within the measuring interval or recognition interval or window, reliable recognition of the operating mode of the engine, that is, within or outside of engine knock condition, is made possible.

DRAWINGS

FIG. 1 is a general schematic diagram of a circuit; and

FIG. 2 illustrates another embodiment.

The basis for the development of the system in accordance with the present invention is the human ear. If a high noise level pertain which, for example, occurs at high engine speed, engine operation under knocking or pinging conditions is clearly audible, and differentiating knocking noise from disturbance or background noise can be done without ambiguity. This discrimination can be carried out also with respect to a tendency to knocking, that is, just at the beginning of knocking operation.

Constructing an electronic model of the human ear, in its entirety, would require excessively complex apparatus, if it would be desired to construct an analog of the human ear capable of encompassing the entire functional range of the human ear. It is known, however, that the knocking noise will occur at a predetermined time and will have a certain frequency; consequently, constructing an analog or a model of the human ear can be substantially simplified by reducing the model for recognition of only those frequencies which are of interest in this case, that is, the knocking frequencies.

Referring to the drawings, and particularly to FIG. 1: A knock sensor 1 has its output connected to at least two branches or channels, in parallel, which, each, have an input filter 2, 3. The central or center pass frequency of the respective filters 2, 3 is different. FIG. 1 only illustrates two such filters and two parallel branch circuits, although more than two filters and more than two branch circuits may be used.

The first filter 2 is connected to a first logarithmic amplifier 4. The second filter 3 is connected to a second logarithmic amplifier 5. The respective logarithmic amplifiers 4, 5 are connected to two respective first and second rectifiers 6, 7 which, in turn, are connected to first and second low-pass filters 8, 9. The respective low-pass filters 8, 9 are connected to a selection or discriminator circuit 10. The selection circuit 10 includes a comparison circuit arrangement, formed by first and second comparators 11, 12. The output of the second rectifier 7 is additionally connected through a threshold circuit 13, which may be constructed in form of a low-pass filter to the direct inputs of the comparators 11, 12. A reference level source to shift the signal level is also provided, the reference level source, for example, forming a voltage divider circuit 14, connected to a source of positive voltage and including at least one adjustable resistor.

The output of the first comparator 11 is connected to an inverting input of an AND-gate 15. The output of the second comparator 12 is connected to a direct input of the AND-gate 15. A third input terminal 15a is provided on AND-gate 15. The third terminal 15a is connected to a timing circuit to establish a timing or measuring interval or window during which the AND-gate 15 is enabled, for example coupled to a circuit which determines whether the piston of an engine, subject to pinging or knocking, is within a certain angular range with respect to TDC position in the respective cylinder.

Reference is made to the above referred-to U.S. Pat. No. 4,106,447, for example, for a system providing such a reference or measuring window. The output of the AND-gate 15 is connected over a time delay circuit with the first input of a second AND-gate 17 and further directly to the AND-gate 17. The output 18 of the AND-gate 17 provides the knocking recognition signal, in binary form, that is: "knocking", yes/no.

Generating a signal for application to terminal 15a to establish a measuring window is also described in German Patent Disclosure Document DE-OS 29 18 420, assigned to the assignee of the present invention.

Operation: The signal from the engine knock sensor 1 is applied to the two filters 2, 3 which have different center or pass frequencies. The frequency $f_1$ of the first filter 2 can be so arranged, for example, that its frequency pass range is matched to frequencies which are known to occur as background or noise or interference signals, that is, frequencies which are to be eliminated, while effectively and highly damping those frequencies which can be expected and are representative of engine knocking signals. The frequency $f_2$ of the second filter 3 should be so selected that it is matched to the expected frequency of the knocking signals. Noise signals, particularly impulses cannot be suppressed by any filter with good effectiveness, and will appear at the output of the second filter 3. Depending on the characteristics of the signals provided by the knock sensor 1, that is, signals which, for example, may have characteristic frequencies of yet a third frequency range or band, can be suppressed by further parallel connected filters, not shown, and connected through similar circuit channels including a logarithmic amplifier, a demodulator, a band-pass filter to yet another comparator connected similarly to comparators 11, 12 and connected to a further input of the AND-gate 15.

The output signals of the selective filters 2, 3 are logarithmically amplified by the logarithmic amplifiers 4, 5. The logarithmic characteristics of the human ear are used as a basis. The logarithmic amplifiers 4, 5 are not absolutely necessary, and can be omitted if the overall system has a wide dynamic range. This, however, requires very expensive components. The rectifiers 6, 7 are provided to rectify or demodulate the signals. The low-pass filters 8,9 form the envelopes of the curves.

The selection circuit 10 is so constructed that the signal of the first filter branch, which generally contains the background or noise signals, is used to either block or open the recognition of occurrence of knocking signals. The signal of the second filter branch, although it will include noise signals together with knocking signals, can be used in its individual form. During the time in which interference persists, recognition by the selection circuit is inhibited or blocked. Thus, a knocking signal which comes just before or just after the interference or noise can be evaluated.

Evaluation of the knocking signal: The comparator circuit of the comparators 11, 12 receives the envelope curves of the signals of the filter branches. These envelope curves are compared with a reference value applied to the comparators 11, 12. The reference threshold value is formed by the output signal derived from the second rectifier 7—that is, the output signal of the branch tuned to the knocking signals. The low-pass filter 13 again forms an envelope. The signal level or reference can be shifted by the level or bias shift circuit 14 to shift the entire envelope derived from the low-pass filter 13.

In the example of FIG. 1, the same reference level is applied to the two comparators 11, 12. It is also possible to form a separate reference for each comparator. The reference level is not necessarily derived from the output signal of the rectifier, since the reference signal can be derived from any stage after rectification. The threshold level can also be so derived that the threshold level changes under a controlled condition, for example upon change of engine speed, ignition advance/retardation angle, or the like.

Upon comparison of the signals of the two filter branches with the reference level, comparators 11, 12 will provide a digital output signal in dependence on whether the threshold level of the respective comparator is exceeded or not. Upon exceeding of the threshold level, a digital output signal of a first level will be obtained; upon passing the threshold level in the reverse direction, the output will have a different level. The comparison thus provides output signals from the comparators 11, 12 which will be a time-dependent bit pattern. The bit pattern is applied to a decoding circuit which, in the example, is the AND-gate 15. The bit pattern from the comparators 11, 12 is so interrogated by the AND-gate 15 that, if interference or noise is sensed, the recognition of knocking is inhibited or blocked. It is released only when no noise or interference signals are present in the noise channel 2-4-6-8-11 or are below the threshold of comparator 11, comparator 11 will provide a 0-signal output to the inverting input of AND-gate 15. If no noise or interference signals are present, and further if the signals from the second branch or channel 3-5-7-9-12 exceed the threshold level as set by the level setting element 14 so that comparator 12 will have a 1-signal output, the output of the AND-gate 15 will provide a recognition signal for knocking—provided that terminal 15a establishing a measuring or timing window—is also enabled.

The recognition signal should be evaluated only within a recognition interval in order to insure that the recognition signal accurately and truly is a knocking signal. Thus, the further input 15a to the AND-gate provides a signal characteristic of presence or absence of a certain timing window, the AND-gate 15 transferring the recognition signal from the comparators only within the timing interval or timing window.

Extremely short time occurrences of the recognition signal at the output of the AND-gate should not be evaluated as pinging or knocking. The delay circuit 16 is provided to permit the output terminal 18 to provide a knocking recognition signal only if a predetermined minimum time has elasped during which a recognition signal is applied to the input of the time delay circuit 16. The minimum timing period of the delay circuit 16 may be adjustable. The output 18 of the second AND-gate 17 thus provides an output signal: "knocking—yes/no" if both inputs to the AND-gate 17 have a recognition signal thereon. The signal at the output 18 can be utilized for further application to an engine control computer, to a warning indicator for the engine operator, and the like.

Embodiment of FIG. 2: The basic arrangement is similar to that of FIG. 1. Only the selection circuit 10' is somewhat differently arranged. The output of the first filter 8 is connected to the inverting input of the comparator 11 and, additionally, to the inverting input of a subtraction circuit 19. The output of the second filter 9 is connected to the direct input of the subtraction circuit 19. The comparators 11,12 have different threshold levels. The threshold levels are generated in the same way as in FIG. 1. The signal of the first filter branch which, essentially, carries the noise or disturbance signals, is subtracted from the signal in the second filter branch which, essentially contains the knocking signals, but, in addition thereto, also contains noise signals. The signals in the two filter branches may have different amplitudes and thus the signal in the first filter branch, for example, can be matched in its amplitude to the signal in the second filter branch. The output from the low-pass filter 8 can be used, as in the embodiment of FIG. 1, for blocking or opening of AND-gate 15 to block or open knocking recognition. In general operation, the system is similar to that of FIG. 1. If the subtraction formed by the subtracting circuit 19 provides for an ideal subtraction of all noise signals, that is, if the subtraction is so effective that no noise signals will be present in the output from the subtraction circuit 19 at all, then comparator 11 need not be used anymore, since there will be no additional requirement to block knocking recognition under condition of noise signals only. If comparator 11 is used, the threshold level thereof is set by low-pass filter 20 and voltage divider circuit 21 to provide an envelope similar to that derived from the low-pass filter 8, but shifted with respect to the output from low-pass filter 8 by a threshold level as set by the voltage divider 21.

Other arrangements to change the signals can be used in the respective filter branches; it is, for example, additionally possible to introduce integrators, differentiators, or squaring circuits for further processing of the signals derived from the filters 2, 3. Thus, the logarithmic circuits 4, 5 which have a signal transfer characteristic somewhat matched to that of the human ear are preferred; other signal processing functions may, however, be employed in lieu thereof, or in addition thereto.

Various changes and modifications may be made, and features described in connection with any one of the embodiments may be used with any of the others, within the scope of the inventive concept.

We claim:

1. Internal combustion engine knocking or pinging sensing and recognition system having
   a sensor (1) providing output signals representative of combustion conditions in a cylinder of the internal combustion engine, in which the combustion condition may cause knocking,
   said output signals including, upon knocking, knocking signals and noise, or stray, or interference signals mixed with the knocking signals, said output signals, under other, or normal combustion conditions, including only said stray, or noise, or interference signals,
   comprising, in accordance with the invention,
   at least two frequency selective filters (2, 3) having different pass frequencies connected to the sensor (1),
   wherein one of the filters (3) is tuned to pass signals having frequencies expected upon engine knocking,
   and at least one other filter (2) is tuned to pass signals having a frequency band of expected stray, or noise, or interference frequencies;
   threshold means (14, 20) connected for establishing a threshold level;
   and comparison circuit means (11, 12) connected to receive the filtered output signals from each of said one filter (3) and said at least one other filter (2) to compare the output from said filters and connected to compare the output from said filters with said threshold level; and
   a logic circuit (15) connected to the comparison circuit means (11, 12) and logically decoding the signals derived therefrom to provide binary output knocking recognition signals
   if, and only if,
   (a) the filtered signal having the frequency expected upon knocking exceeds the threshold level, and
   (b) the filtered signals having a frequency band of expected stray, or noise, or interference frequencies is below the threshold level.

2. System according to claim 1, further including non-linear amplifier means (4, 5) connected between the filters (2, 3) and the comparison circuit means (11, 12).

3. System according to claim 1, further including logarithmic amplifier means (4, 5) connected between the filters (2, 3) and the comparison circuit means (11, 12).

4. System according to claim 1 wherein the comparison circuit means comprises a plurality of comparators (11, 12), each comparator being connected to receive the output from a respective one of the filters (2, 3).

5. System according to claim 4, wherein (FIG. 1) the threshold means comprises a threshold setting circuit (14) connected to receive the signals from the filter (3) tuned to the knocking signal frequency, and having its output connected to the comparators (11, 12) for establishing a common threshold level therefor.

6. System according to claim 4, wherein (FIG. 2) the threshold means comprises separate threshold circuits (14, 21), one of the threshold circuits being connected to the comparator (12) receiving the signals from the filter (3) tuned to the knocking signal frequency, and another threshold level circuit (21) being connected to the comparator (11) receiving signals from the filter (2) tuned to noise frequencies.

7. System according to claim 1, wherein the logic circuit comprises an AND-gate (15).

8. System according to claim 1, further including a time delay circuit (16) connected to receive the output from the logic circuit (15) and providing an output signal representative of knocking only if said output signal persists for a predetermined time, as determined by said timing circuit (16).

9. System according to claim 1, further including rectifier means (6, 7) connected to receive the signals from the respective filters (2, 3);
   and low-pass filter means (8, 9) connected to receive the rectified, filtered signals and applying said rectified, filtered signals to said selection and discriminating circuit (10) in the form of signal envelopes.

10. System according to claim 9, further including non-linear, preferably logarithmic amplifier circuit means (4, 5) connected between the output of the filters (2, 3) and the inputs to the rectifier means (6, 7).

11. System according to claim 1, wherein said comparison circuit means includes comparators (11, 12) connected to receive the outputs from the respective filters (2, 3);
   and the threshold means comprises
   means (6, 7) rectifying the output from the filters (2, 3);
   and threshold level setting means (13, 14; 20, 21) connected to said comparison circuit means (11, 12) to set the comparison threshold levels thereof, said threshold level setting means being additionally connected to the signal path between said filter output rectifying means (6, 7) and said comparison circuit means.

12. System according to claim 11, including low-pass filter means (13, 20) foming part of said threshold level setting means and connecting the signal path to provide a threshold level which follows the envelope of the signals derived from at least one of said filters.

13. Method of determining knocking or pinging operation of an internal combustion engine having a sensor (1) providing output signals representative of combustion conditions in a cylinder of the internal combustion engine, in which the combustion conditions may cause knocking, said output signals including, upon knocking, knocking signals and noise, or stray, or interference signals mixed with the knocking signals, and said output signals, under other, or normal combustion conditions, including said stray, or noise, or interference signals, comprising the steps of filtering the output signals from the sensor to derive a first filtered signal having frequencies expected upon engine knocking, and at least one other filtered signal having frequencies within a frequency band expected from stray, or noise, or interference signals;

comparing said first and second filtered signals with respect to a threshold and deriving first and second comparison signals indicative if the respective filtered signals are below or above said threshold;

logically combining the first and second comparison signals to provide a knock indication output signal upon the logical conjunction of:

(a) the filtered signal having the frequency expected upon knocking is in excess of the threshold level; and (b) the filtered signal having the frequency band of expected stray, or noise, or interference frequencies is below said threshold level.

14. Method according to claim 13, further including the step of analyzing whether the knocking indication signal persists for a predetermined time interval, and providing a "knock" output signal if, and only if, said predetermined time period is exceeded.

15. Method according to claim 13, including the step of generating the threshold level as a function of the signal level of the signal which is tuned to the frequencies expected upon engine knocking.

* * * * *